United States Patent [19]

Hua-Chu

[11] Patent Number: 5,534,752
[45] Date of Patent: Jul. 9, 1996

[54] SHUTTER LINKAGE FOR AN ION IMPLANTATION APPARATUS

[75] Inventor: Chung Hua-Chu, Hsin-Chu, Taiwan

[73] Assignee: Taiwan Semiconductor Manufacturing Company, Hsinchu, Taiwan

[21] Appl. No.: 507,534

[22] Filed: Jul. 26, 1995

[51] Int. Cl.⁶ .................................................. H01J 37/08
[52] U.S. Cl. .................. 315/111.81; 315/111.21; 315/111.91
[58] Field of Search ................................. 384/436, 445, 384/609, 610, 613, 618; 403/113, 114, 115, 119, 121, 122; 315/111.81, 111.91, 111.21, 111.31

[56] References Cited

U.S. PATENT DOCUMENTS

| | | | |
|---|---|---|---|
| 4,090,452 | 5/1978 | Segar | 104/247 |
| 4,242,591 | 12/1980 | Harville | 290/1 R |

*Primary Examiner*—Robert Pascal
*Assistant Examiner*—David H. Vu
*Attorney, Agent, or Firm*—George O. Saile; Wolmar J. Stoffel

[57] ABSTRACT

An improved shutter activating mechanism for an ion implantation apparatus, used to implant ions into semiconductor wafers, is described. The apparatus has an ion source, an ion accelerator, an ion beam shutter, and an ion beam shaping plate system. The improvement consists of a improved shutter activating mechanism with a rotatable shaft fixed to the ion beam shutter, a cross bar fed to the rotatable shaft, a abutment surface for limiting rotational movement of the cross bar, and a driving solenoid provided with a push rod. A bifurcated element is fixed to the end of the push rod which has aligned transverse apertures, a link joining the bifurcated element and the push rod, the link having an aperture on one end, a bearing assembly to allow limited axial movement, an a first pin through the transverse aperture and the bearing assembly. The link has a bifurcated end with transverse aperture. A second pin provides a connection between the bifurcated end of the link and the cross bar.

10 Claims, 4 Drawing Sheets

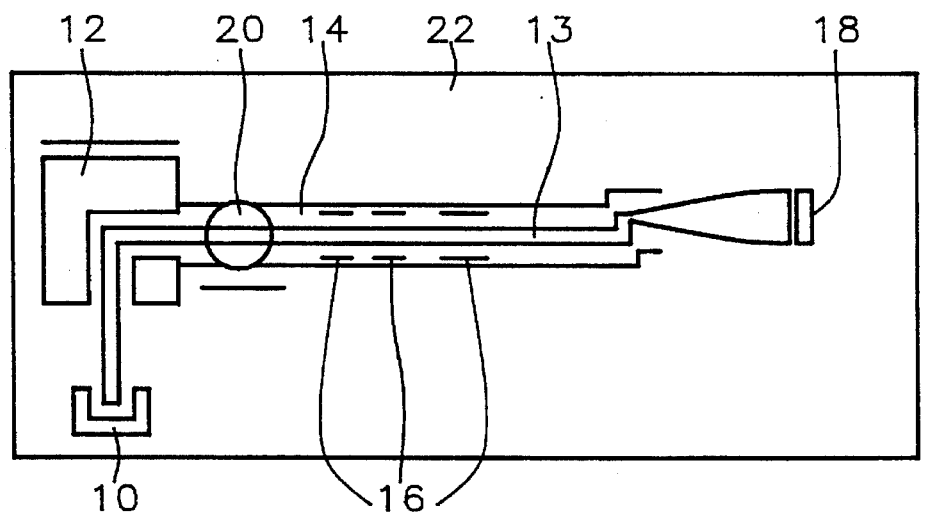
FIG. 1 - Prior Art
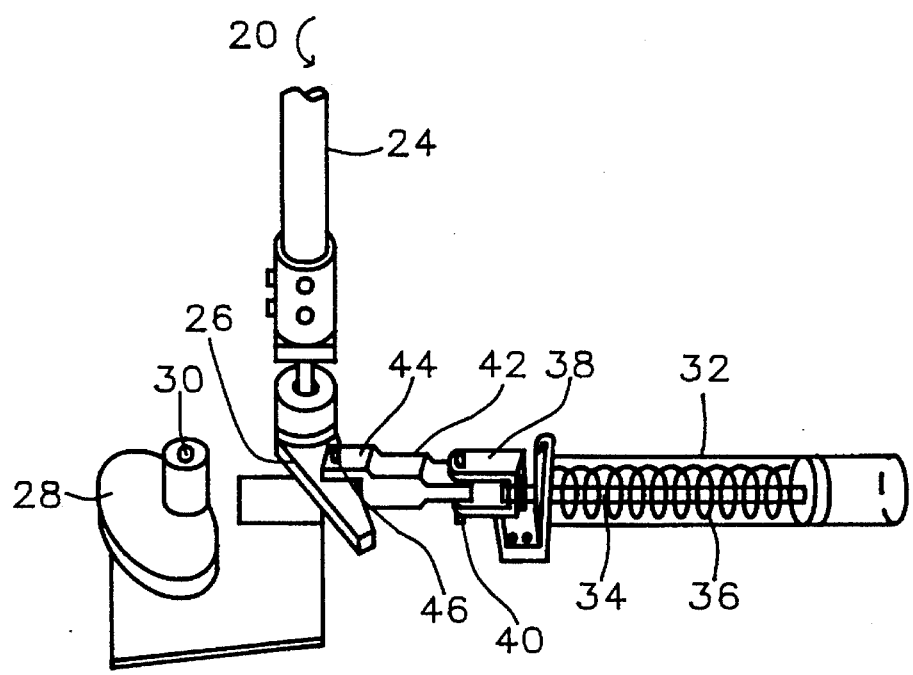
FIG. 2 - Prior Art

SHUTTER LINKAGE FOR AN ION IMPLANTATION APPARATUS

BACKGROUND OF THE INVENTION (1) Field of the Invention

The present invention relates to improvements in ion implantation apparatus used in the manufacture of integrated circuit semiconductor devices, more particularly to an improved mechanism for moving the shutter used to control the ion beam in the apparatus.

(2) Description of the Prior Art

The basic elements of an ion implantation apparatus are illustrated in FIG. 1. An ion source 10 provides suitable impurity ions, which are accelerated from the source 10 by a magnetic field 12 into a beam 13 that enters tube 14. Beam shaping plates 16 shape the beam to provide a uniform dispersion of ions. The ions are subsequently implanted into semiconductor wafer 18. A shutter 20 controls the ion beam exposure of the wafer 18 by either shutting off the beam or allowing it to proceed to the wafer. The elements are mounted in chamber 22.

A known mechanism for rotating shutter 20 is illustrated in FIG. 2. The shutter 20 is mounted on rotatable shaft 24. Cross bar 26 is fixed to shaft 24. An abutment means is provided to limit the rotational movement of bar 26, shaft 24, and shutter 20. A cam 28 can be used as an adjustable abutment by rotating it about axis 30 until the cam surface is in the proper position to provide the desired stop for cross bar 26. An actuating one-way solenoid 32 having a push rod 34 and a return spring 36 is used to rotate shutter 20. A bifurcated element 38, provided with a steel pin 40, is affixed to push rod 34, as shown. A link 42 with a bifurcated end 44 is connected to the bifurcated element 38 by pin 40 to provide a articulated connection between cross bar 26 and push rod 34. Link 42 is joined to cross bar 26 with steel pin 46.

In operation the pins 40 and 46 are subjected to high impact forces, particularly when the cross bar strikes the abutment cam surface. This results in very significant sheer forces and wear since the shutter must be opened very frequently. The sheer force is so high that the pins may be cut off. As the linkage is operated, both the pins and the apertures are subject to wear resulting in loosely fitting pins. This looseness in turn compounds the sheer actions on the pins resulting in premature failure. In a typical failure, the pin 40 would be cut off by the sheer force. A failure of the linkage will result in inappropriate implanted ion concentrations in the wafer in the apparatus, and possibly more wafers if the failure is not noticed immediately. Further, even looseness of the linkage without a catastrophic failure could alter the amount of ions that are implanted, resulting in ruined product, or product of lower quality.

SUMMARY OF THE INVENTION

It is an object of the invention to provide an improved shutter activating mechanism for ion implantation apparatus used to implant ions into semiconductor wafers.

Another object of the invention is to provide a more dependable shutter activating mechanism that is less prone to wear and malfunction, and that maintains an accurate time exposure of the ion beam because the period of the shutter will not vary.

Yet another object of the invention is to provide an improved shutter activating mechanism for ion implantation apparatus that is simple and inexpensive to build, repair and maintain.

In accordance with the aforementioned objectives there is provided an improvement in ion implantation apparatus for implanting ions into semiconductor substrates, which apparatus has an ion source, an ion accelerator, an ion beam shutter, and an ion beam shaping plates, the improvement being an improved shutter activating mechanism with a rotatable shaft fixed to the ion beam shutter, a cross bar fixed to the rotatable shaft, an abutment surface for limiting rotational movement of the cross bar, and a driving solenoid provided with a push rod. A bifurcated element is fixed to the end of the push rod which has aligned transverse apertures, a link joining the bifurcated element and the push rod, the link having an aperture on one end, a bearing assembly to allow limited axial movement, and a first pin through the transverse aperture and the bearing assembly. The link has a bifurcated end with transverse aperture. A second pin provides a connection between the bifurcated end of the link and the cross bar.

BRIEF DESCRIPTION OF THE DRAWINGS

FIG. 1 is a general schematic view of an ion implantation apparatus, known to the prior art, which depicts the elements and the layout of the apparatus.

FIG. 2 is a perspective view of a shutter activating mechanism of an ion implantation apparatus known to the prior art.

DESCRIPTION OF THE PREFERRED EMBODIMENTS

Figure 3A:
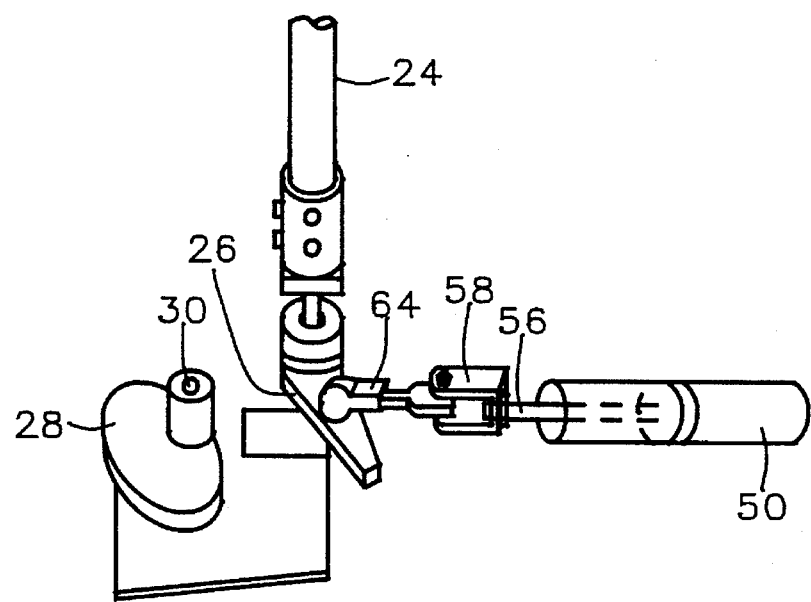
FIG. 3A is a perspective view of a preferred specific embodiment of the improved shutter activation mechanism of the invention.
Figure 5:
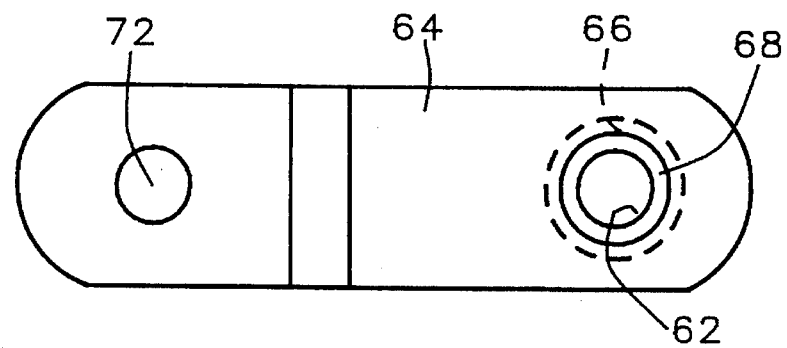
FIG. 5 is a top view of the link element of the linkage shown in FIG. 4.

Referring now to the Figs. of the drawings, and in particular to FIGS. 3A through 6, there is depicted a preferred specific embodiment of the improvement to ion implantation apparatus. In FIG. 3A, the elements in common with FIG. 2 have been designated with the same numerals.

In FIG. 3A, as in FIG. 2, shaft 24 moves beam shutter 20, shown in FIG. 1. A cross bar 26 is affixed to shaft 24. A cam 28, rotatable about pivot 30, provides an adjustable abutment surface for limiting movement of cross bar 26, and beam shutter 20.

Figure 6:
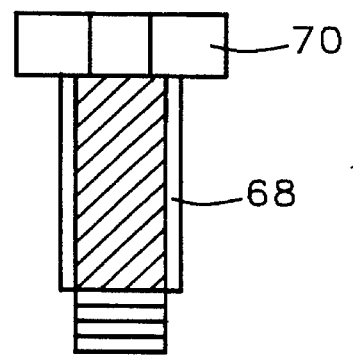
FIG. 6 is an elevated view of a pin and plastic sleeve used in the shutter activation mechanism.
Figure 3B:
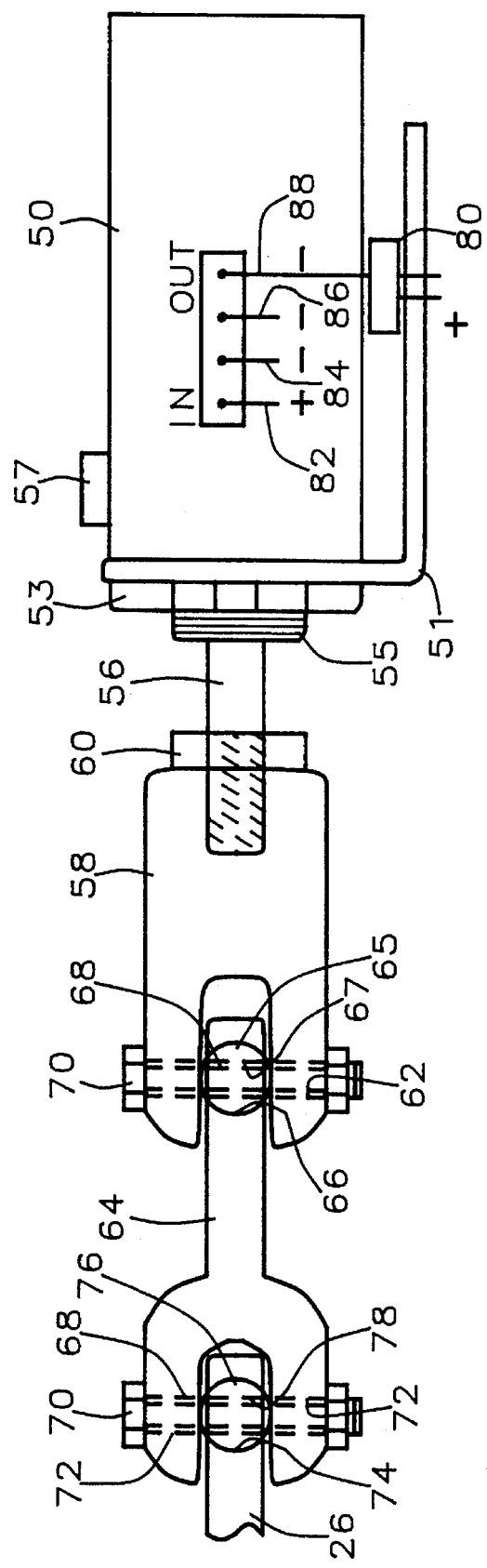
FIG. 3B is a detailed view of the right part of FIG. 3A.
Figure 4:
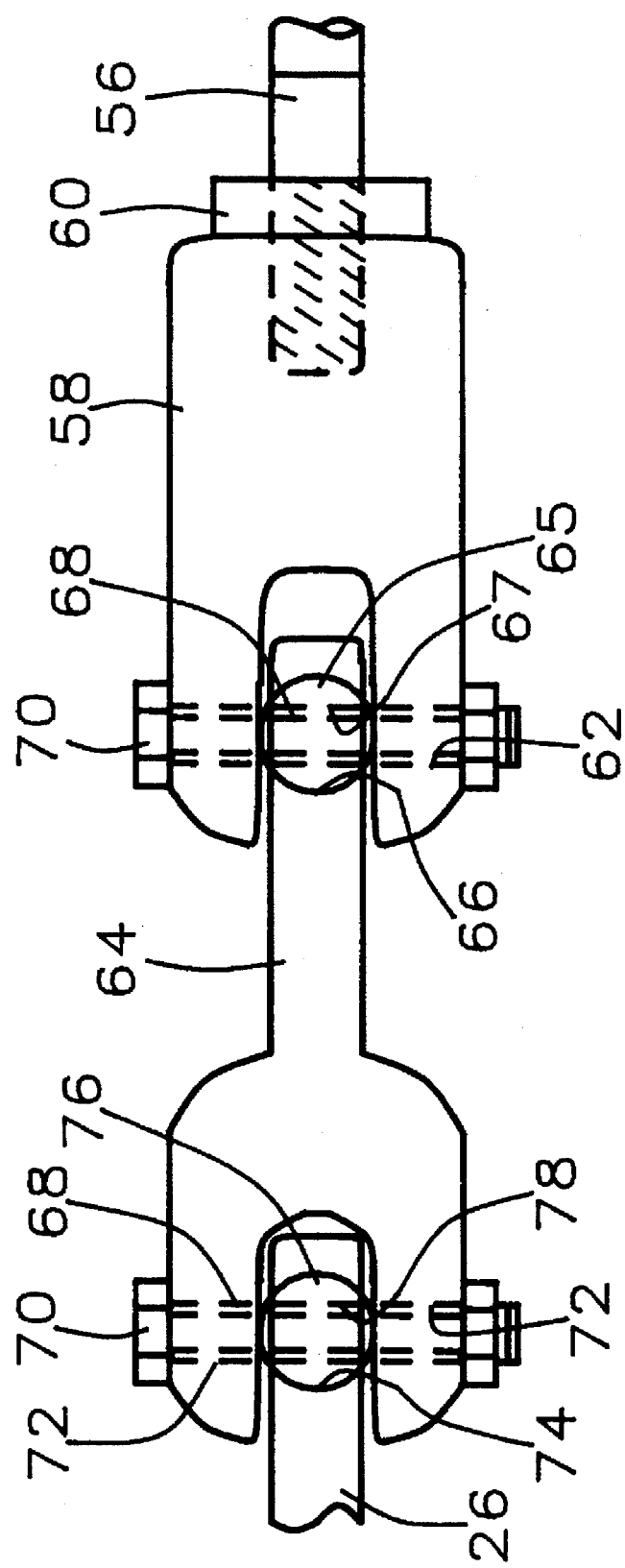
FIG. 4 is a side elevational view in enlarged scale of a preferred embodiment of the linkage between the cross bar and the actuating solenoid.

A double actioned solenoid 50 is provided to move cross bar 26. Solenoid 50 is shown supported by bracket 51 and secured by nut 53 on threaded collar 55. Solenoid 50 preferably has a regulator 57 to control the speed of the push rod 56 of solenoid 50. The end of push rod 56 is connected to cross bar 26 through a linkage, shown in greater detail in FIG. 3A, FIG. 3B and 4 in larger scale. A bifurcated element 58 is threadably mounted on the end of push rod 56, and secured by lock nut 60. The bifurcated element has aligned apertures 62 that are transverse to the longitudinal axis of push rod 56. A link 64, provided with a truncated sphere shaped seating opening 66 at a first end, is positioned with one end between the prongs of bifurcated element 58. A spherical bearing element 65 having a diametral aperture 67 is seated in opening 66. A plastic sleeve element 68 is positioned in aligned apertures 62, and aperture 66, with a pin 70 within sleeve element 68, preferably force fit. Pin 70 and sleeve 68 are shown in FIG. 6. On the opposite end of link 64 is a bifurcated end with spaced prongs. The prongs have aligned transverse apertures 72. A truncated sphere shaped seating opening 74 is provided in cross bar 26 that receives a spherical bearing 76 having a diametral aperture 78. Bearing 78 and opening 76 are similar to bearing 65 and opening 66 that were described previously. A pin 70 and sleeve 65 in aperture 72 and 78 connect the bifurcated end of link 64 to cross bar 26. The pin 70 and sleeve 68 are preferably press fit into the link and cross bar. Pin is preferably hardened steel.

The solenoid 50 is preferably double-actioned, i.e. an electrical current is needed to drive the push rod in either direction. Also regulators are provided to control the speed of the push rod. Since the solenoid is double-actioned, it is always in the active magnetism state. Ordinarily this means that the solenoid is always on and is thereby generating heat. This would reduce the working lifetime of the solenoid. However, in operation the time that the shutter 20 is held open is very short in comparison to the time that it is open. In order to reduce the time that the solenoid is activated, a relay 80 to terminals 86 and 88 is provided to drive the solenoid to close the shutter 20. The relay is used to turn on the relay long enough to drive the shutter to the close position. To open the shutter and hold it open, the solenoid is operated in the normal manner by applying current to terminals 82 and 84. Thus current is applied to the solenoid during the short time that the shutter 20 is open and for the time necessary to close the shutter.

The linkage joining the push rod of the solenoid to the cross bar 26 that moves the shutter 20 is a significant improvement over the prior art linkage shown in FIG. 2, and also the usual linkage used for the purpose. The bearing elements 65 and 78 provide another degree of movement of the pins that reduces vibration and reduces wear and stress on the elements. This reduces maintenance and increases the life of the components, while providing a more precise control of implant dosages. It has been discovered that a single action solenoid, i.e. a solenoid where the push rod is driven in only one direction and a spring drives the push rod in the opposite direction, will not maintain constant speed and power over longer periods of operation. A double action solenoid, particularly in combination with a relay as described, will have a longer lifetime, with more constant operational parameters.

While the invention has been particularly shown and described with reference to the preferred embodiments thereof, it will be understood by those skilled in the art that various changes in form and details may be made without departing from the spirit and scope of the invention.

What is claimed is:

1. In an ion implantation apparatus for implanting ions into a masked semiconductor wafer, which apparatus has an ion source, an ion accelerator, an ion beam shaping means, an ion beam shutter, and a chamber enclosing the aforementioned elements, the improvement comprising an improved mechanism for activating said ion beam shutter having:

a rotatable shaft fixed to said ion beam shutter, a cross bar fixed to said rotatable shaft, an abutment means for limiting rotational movement of said cross bar, a driving solenoid provided with a push rod, a bifurcated element having first spaced prongs an end fixed to the end of said push rod, aligned transverse apertures in said first spaced prongs, a link joining said bifurcated element and said cross bar, said link having:

a first truncated sphere shaped seating opening in a first end, a first spherical bearing element having a diametral aperture seated in said first truncated sphere shaped seating opening, a first pin joining the first spaced prongs of said bifurcated element to said first end of said link, said first pin passing through the aligned apertures of said first spaced prongs of said bifurcated element and said diametral aperture in said first spherical bearing element on said link, second spaced prongs with aligned transverse apertures on the opposite second end of said link, a second truncated sphere shaped seating opening in said cross bar, a second spherical bearing element having a diametral aperture seated in said second sphere shaped seating opening in said cross bar, and a second pin joining said cross bar to said second end of said link by passing through said aligned transverse apertures of said second spaced prongs and through said diametral aperture in said second spherical bearing element on said cross bar, whereby said first and second spherical bearing elements cause uniform distribution of forces on said first and second pins during opening and closing of said ion beam shutter.

2. The apparatus of claim 1 which further includes plastic sleeves over said first and second pins.

3. The apparatus of claim 2 wherein said first and second pins with plastic sleeves are force fitted in the apertures of said prongs and said diametral apertures of said spherical bearing elements.

4. The apparatus of claim 2 wherein said spherical bearing element is hardened steel.

5. The apparatus of claim 1 wherein said abutment means is a camming element.

6. The apparatus of claim 5 wherein said camming element is rotatable and is adapted to provide a variable position abutment to a surface on cross bar.

7. The apparatus of claim 1 wherein said driving solenoid is double acting.

8. The apparatus of claim 1 in which said driving solenoid is double acting and a relay is provided to control electrical current when said beam shutter is moved to the closed position.

9. The apparatus of claim 8 wherein a means is provided to turn off said relay after the shutter is moved to the close position.

10. The apparatus of claim 1 wherein said first and second pins are hardened steel.

* * * * *